United States Patent
Balseanu et al.

(10) Patent No.: US 10,714,331 B2
(45) Date of Patent: Jul. 14, 2020

(54) METHOD TO FABRICATE THERMALLY STABLE LOW K-FINFET SPACER

(71) Applicant: Applied Materials, Inc., Santa Clara, CA (US)

(72) Inventors: Mihaela Balseanu, Cupertino, CA (US); Srinivas D. Nemani, Sunnyvale, CA (US); Mei-Yee Shek, Palo Alto, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/354,654

(22) Filed: Mar. 15, 2019

(65) Prior Publication Data

US 2019/0311896 A1 Oct. 10, 2019

Related U.S. Application Data

(60) Provisional application No. 62/652,447, filed on Apr. 4, 2018.

(51) Int. Cl.
*H01L 21/02* (2006.01)
*H01L 29/66* (2006.01)
(Continued)

(52) U.S. Cl.
CPC ...... *H01L 21/02167* (2013.01); *C23C 16/345* (2013.01); *C23C 16/36* (2013.01);
(Continued)

(58) Field of Classification Search
CPC . C23C 16/345; C23C 16/36; C23C 16/45525; C23C 16/46; H01L 21/02126;
(Continued)

(56) References Cited

U.S. PATENT DOCUMENTS 4,524,587 A   6/1985  Kantor
4,879,259 A  11/1989  Reynolds et al.
(Continued)

FOREIGN PATENT DOCUMENTS

CN   101871043 A   10/2010
CN   104047676 A    9/2014
(Continued)

OTHER PUBLICATIONS

International Search Report and Written Opinion for International Application No. PCT/US2019/029602 dated Aug. 14, 2019.
(Continued)

*Primary Examiner* — Joseph M Galvin, III
(74) *Attorney, Agent, or Firm* — Patterson + Sheridan LLP

(57) ABSTRACT

A method for forming a thermally stable spacer layer is disclosed. The method includes first disposing a substrate in an internal volume of a processing chamber. The substrate has a film formed thereon, the film including silicon, carbon, nitrogen, and hydrogen. Next, high pressure steam is introduced into the processing chamber. The film is exposed to the high pressure steam to convert the film to reacted film, the reacted film including silicon, carbon, oxygen, and hydrogen.

20 Claims, 3 Drawing Sheets

(51) Int. Cl.
  *C23C 16/46* (2006.01)
  *C23C 16/34* (2006.01)
  *C23C 16/36* (2006.01)
  *C23C 16/455* (2006.01)

(52) U.S. Cl.
  CPC ........ *C23C 16/45525* (2013.01); *C23C 16/46* (2013.01); *H01L 21/0228* (2013.01); *H01L 21/02126* (2013.01); *H01L 21/02337* (2013.01); *H01L 29/66795* (2013.01)

(58) Field of Classification Search
  CPC ......... H01L 21/02167; H01L 21/02219; H01L 21/0228; H01L 21/02326; H01L 21/02337; H01L 21/67017; H01L 21/67103; H01L 21/67126; H01L 21/6719; H01L 29/66795
  See application file for complete search history.

(56) References Cited

U.S. PATENT DOCUMENTS

| | | |
|---|---|---|
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,175,123 A | 12/1992 | Vasquez et al. |
| 5,319,212 A | 6/1994 | Tokoro |
| 5,366,905 A | 11/1994 | Mukai |
| 5,578,132 A | 11/1996 | Yamaga et al. |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,468,490 B1 | 10/2002 | Shamouilian et al. |
| 6,500,603 B1 | 12/2002 | Shioda |
| 6,583,497 B2 | 6/2003 | Xia et al. |
| 6,619,304 B2 | 9/2003 | Worm |
| 6,627,532 B1 | 9/2003 | Gaillard et al. |
| 6,730,593 B2 | 5/2004 | Yau et al. |
| 6,797,336 B2 | 9/2004 | Garvey et al. |
| 7,055,333 B2 | 6/2006 | Leitch et al. |
| 7,084,079 B2 | 8/2006 | Conti et al. |
| 7,111,630 B2 | 9/2006 | Mizobata et al. |
| 7,114,517 B2 | 10/2006 | Sund et al. |
| 7,211,525 B1 | 5/2007 | Shanker et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Li et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 10,096,516 B1 | 10/2018 | Leschkies et al. |
| 10,276,411 B2 | 4/2019 | Delmas et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0066535 A1 | 6/2002 | Brown et al. |
| 2002/0073922 A1 | 6/2002 | Frankel et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2003/0030945 A1 | 2/2003 | Heinonen et al. |
| 2003/0049372 A1 | 3/2003 | Cook et al. |
| 2003/0101938 A1 | 6/2003 | Ronsse et al. |
| 2003/0148035 A1 | 8/2003 | Lingampalli |
| 2003/0148631 A1 | 8/2003 | Kuo et al. |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0105107 A1 | 5/2006 | Lindeboom et al. |
| 2006/0124613 A1 | 6/2006 | Kumar et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0083109 A1 | 4/2008 | Shibata et al. |
| 2008/0115726 A1 | 5/2008 | Ingle et al. |
| 2008/0121882 A1 | 5/2008 | Hwang et al. |
| 2008/0210273 A1 | 9/2008 | Joe |
| 2009/0018688 A1 | 1/2009 | Chandler et al. |
| 2009/0081884 A1 | 3/2009 | Yokota et al. |

(56) References Cited

U.S. PATENT DOCUMENTS

| | | |
|---|---|---|
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0288485 A1* | 10/2013 | Liang ............... H01L 21/02282 438/782 |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0314964 A1 | 10/2016 | Tang et al. |
| 2016/0334162 A1 | 11/2016 | Kim et al. |
| 2016/0336405 A1 | 11/2016 | Sun et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0084487 A1 | 3/2017 | Chebiam et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1* | 1/2018 | Chandra ............ H01L 21/02219 438/760 |
| 2018/0261480 A1 | 9/2018 | Liang et al. |
| 2018/0286674 A1 | 10/2018 | Manna et al. |
| 2018/0315626 A1 | 11/2018 | Franklin |
| 2018/0337027 A1 | 11/2018 | L'Heureux et al. |
| 2018/0342384 A1 | 11/2018 | Wong et al. |
| 2018/0350563 A1 | 12/2018 | Manna et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0228982 A1 | 7/2019 | Chen et al. |
| 2019/0237345 A1 | 8/2019 | Delmas et al. |
| 2019/0258153 A1 | 8/2019 | Nemani et al. |
| 2019/0259625 A1* | 8/2019 | Nemani ............... H01L 21/0332 |
| 2019/0279879 A1 | 9/2019 | Singh et al. |
| 2019/0311896 A1 | 10/2019 | Balseanu et al. |
| 2019/0368035 A1 | 12/2019 | Malik et al. |
| 2020/0035509 A1 | 1/2020 | Khan et al. |
| 2020/0035513 A1 | 1/2020 | Khan et al. |
| 2020/0098574 A1 | 3/2020 | Wong et al. |

FOREIGN PATENT DOCUMENTS

| | | |
|---|---|---|
| CN | 104089491 A | 10/2014 |
| JP | S63-004616 | 1/1988 |
| JP | H06-283496 | 10/1994 |
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2009129927 A | 6/2009 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20030052162 A | 6/2003 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2005057663 A2 | 6/2005 |
| WO | 2008/089178 A2 | 7/2008 |
| WO | 2011/103062 A2 | 8/2011 |
| WO | 2012/133583 A1 | 10/2012 |

(56) References Cited

FOREIGN PATENT DOCUMENTS

| WO | 2016018593 A1 | 2/2016 |
|---|---|---|
| WO | 2016065219 A1 | 4/2016 |

OTHER PUBLICATIONS

Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2019/014759 dated May 14, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
Taiwan Office Action dated Jun. 11, 2019 for Application No. 107138905.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
International Search Report and Written Opinion for PCT/US2018/050464 dated Jan. 4, 2019.

\* cited by examiner

METHOD TO FABRICATE THERMALLY STABLE LOW K-FINFET SPACER

CROSS-REFERENCE TO RELATED APPLICATIONS

This application claims priority to U.S. Provisional Patent No. 62/652,447, filed Apr. 4, 2018, which is hereby incorporated by reference in its entirety.

BACKGROUND

Field

Embodiments of the present disclosure generally relate to methods and apparatus for forming a spacer layer in FinFET devices.

Description of the Related Art

In response to an increased need for smaller electronic devices with denser circuits, devices with three dimensional (3D) structures have been developed. An example of such devices includes Fin Field Effect Transistors (FinFETs), which have conductive fin-like structures that are raised vertically above a horizontally extending substrate. In light of the continued demand for continually smaller devices, the demands for improved qualities of film layers, such as spacer layers, used in such FinFET devices, continues to increase. Such spacer layers are used to improve device performance by reducing parasitic capacitance. As the demand for improvements to FinFET devices grows, so too does the requirements for the methods used to fabricate these FinFET devices.

One of the operations in creating a FinFET structure includes depositing a film on the underlying substrate. However, the deposited film can be of unacceptable quality, with incorrect dielectric or electrical properties, such as a dielectric constant that is too high or too low. In addition, the etch rate of the film layer after using conventional methods is significantly higher than desired. Thermal stabilizing elements, such as carbon, are also released from the film layer using conventional techniques.

Therefore, there is a need in the art for methods for improving the quality of films in FinFET structures.

SUMMARY

In one embodiment, a method of forming a spacer layer is provided, including disposing a substrate in an internal volume of a processing chamber, the substrate having a film formed thereon, the film including silicon, carbon, nitrogen, and hydrogen, introducing a process gas into the processing chamber, wherein the process gas includes high pressure steam, exposing the film to the process gas to form a reacted film, such that the reacted film includes silicon, carbon, oxygen, and hydrogen, and purging the internal volume with an inert gas.

In another embodiment, a method of forming a spacer layer is provided, including disposing a substrate in an internal volume of a processing chamber, the substrate having a film formed thereon, the film including silicon, carbon, nitrogen, and hydrogen, introducing a process gas into the processing chamber, wherein the process gas includes high pressure steam, exposing the film to the process gas to form a reacted film, such that the reacted film includes silicon, carbon, oxygen, and hydrogen, purging the internal volume with an inert gas, and treating the reacted film with a hydrogen anneal.

In another embodiment, a method of forming a spacer layer is provided, including disposing a substrate in an internal volume of a processing chamber, the substrate having a film formed thereon, the substrate including silicon and germanium, the film including silicon, carbon, nitrogen, and hydrogen, introducing a process gas into the processing chamber, wherein the process gas includes high pressure steam, exposing the film to the process gas to form a reacted film, such that the reacted film includes silicon, carbon, oxygen, and hydrogen, purging the internal volume with an inert gas, and treating the reacted film with a hydrogen anneal.

The high pressure steam in the provided method removes the incorporated nitrogen of the film, and incorporates more thermodynamically stable oxygen into the film. The carbon is not removed from the reacted film, and the carbon contributes to the dielectric constant of the reacted film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include a method for forming a thermally stable spacer layer. The method includes first disposing a substrate in an internal volume of a processing chamber. The substrate has a film formed thereon. Next, high pressure steam is introduced into the processing chamber. The substrate having the film disposed thereon is exposed to the high pressure steam to convert the film to a reacted film. The nitrogen in the film can be removed, and the reacted film contains oxygen. Embodiments of the disclosure provided herein may be especially useful for, but are not limited to, conversion of a silicon carbon amine (SiCNH) film to a silicon carbon hydroxide (SiCOH) reacted film.

As used herein, the term "about" refers to a +/−10% variation from the nominal value. It is to be understood that such a variation can be included in any value provided herein.

Figure 1:
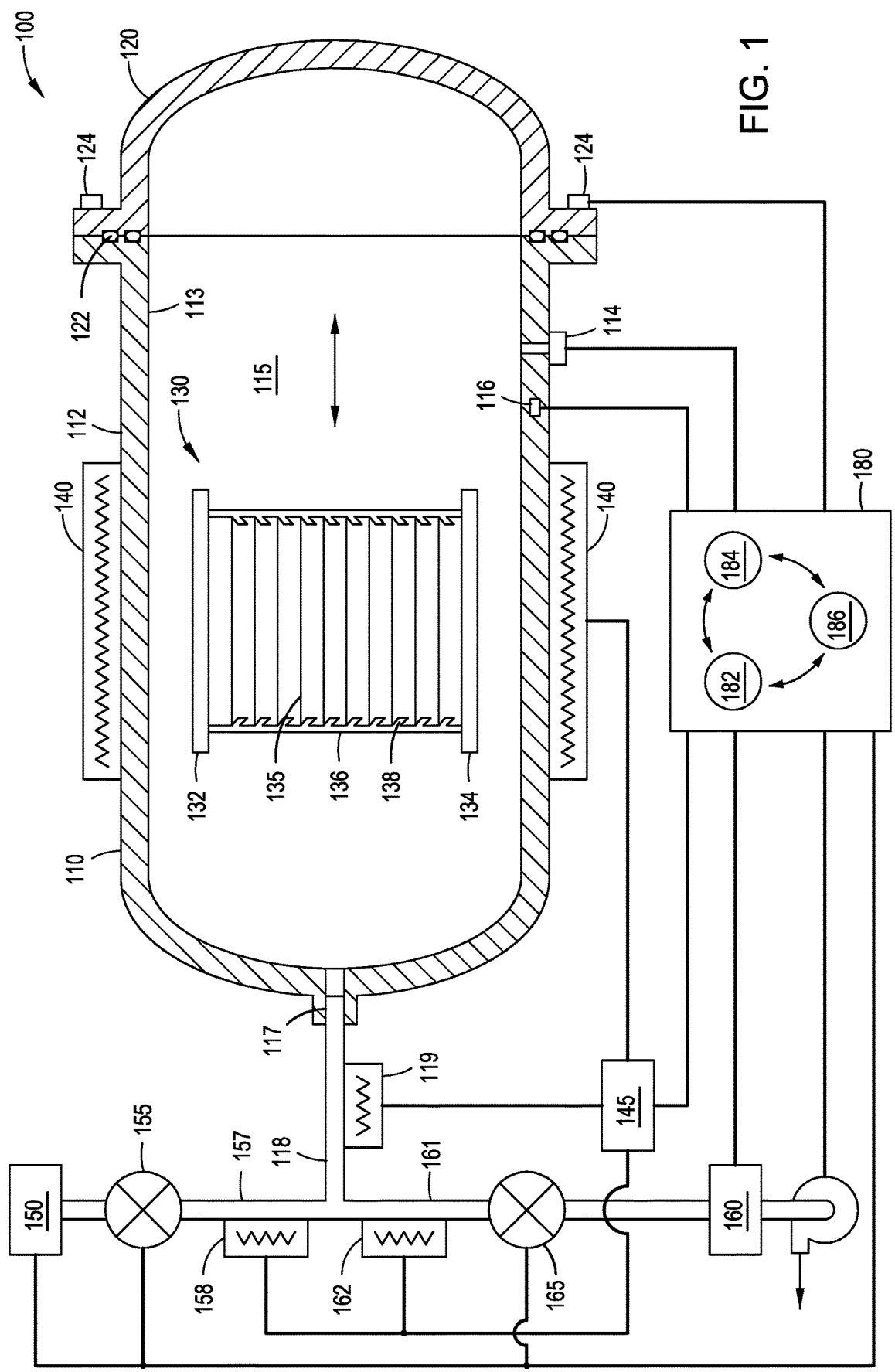
FIG. 1 illustrates a schematic front cross-sectional view of a batch processing chamber, according to one embodiment.

FIG. 1 illustrates a schematic front cross-sectional view of a batch processing chamber 100, according to one embodiment. The batch processing chamber 100 has a body 110 with an outer surface 112 and an inner surface 113 that encloses an internal volume 115. In some embodiments, such as in FIG. 1, the body 110 has an annular cross section, though in other embodiments the cross-section of the body may be rectangular or any closed shape. The outer surface 112 of the body 110 may be made from a corrosion resistant steel (CRS), such as but not limited to, stainless steel. The inner surface 113 of the body 110 may be made from nickel-based steel alloys that exhibit high resistance to corrosion, such as but not limited to, HASTELLOY®, INCONEL®, or MONEL®, among others.

The batch processing chamber 100 has a door 120 configured to selectively enclose the internal volume 115 within the body 110. A seal 122 is utilized to seal the door 120 to the body 110 in order to seal the internal volume 115 for processing. The seal 122 may be made from a polymer, such as, but not limited to, a perfluoroelastomer. A cooling channel 124 is disposed on the door 120 adjacent to the seals 122 wherein a cooling agent is flowed in order to maintain the seals below the maximum safe-operating temperature of the seals. The flow of the cooling agent within the cooling channel 124 is controlled by a controller 180 through feedback received from a temperature sensor 116 or a flow sensor (not shown).

The batch processing chamber 100 has a port 117 through the body. The port 117 has a pipe 118 therethrough, and the pipe is coupled to a heater 119. One end of the pipe 118 is connected to the internal volume 115. The other end of the pipe 118 bifurcates into an inlet conduit 157 and an outlet conduit 161. The inlet conduit 157 is fluidly connected to a gas panel 150 via an isolation valve 155 and further coupled to a heater 158. The outlet conduit 161 is fluidly connected to a condenser 160 via an isolation valve 165 and coupled to a heater 162. The heaters 119, 158, and 162 are configured to maintain a processing gas flowing through the pipe 118, inlet conduit 157, and the outlet conduit 161, respectively, at a temperature above the condensation point of the processing gas. The heaters 119, 158, and 162 are powered by a power source 145.

The gas panel 150 is configured to provide a processing gas under pressure into the inlet conduit 157 for transmission into the internal volume 115 through the pipe 118. The pressure of the processing gas introduced into the internal volume 115 is monitored by a pressure sensor 114 coupled to the body 110. The condenser 160 is fluidly coupled to a cooling fluid and configured to condense a gaseous product flowing through the outlet conduit 161 after removal from the internal volume 115 through the pipe 118. The condenser 160 converts the gaseous products from the gas phase into liquid phase. A pump 170 is fluidly connected to the condenser 160 and pumps out the liquefied products from the condenser 160. The operation of the gas panel 150, the condenser 160, and the pump 170 are controlled by the controller 180.

One or more heaters 140 are disposed on the body 110 and configured to heat the internal volume 115 within the batch processing chamber 100. In some embodiments, the heaters 140 are disposed on an outer surface 112 of the body 110 as shown in FIG. 1, though in other embodiments, the heaters may be disposed on an inner surface 113 of the body. The heaters 140 are powered by the power source 145. Power to the heaters 140 is controlled by a controller 180 through feedback received from a temperature sensor 116. The temperature sensor 116 is coupled to the body 110 and monitors the temperature of the internal volume 115.

A cassette 130 coupled to an actuator (not shown) is moved in and out of the internal volume 115. The cassette 130 has a top surface 132, a bottom surface 134, and a wall 136. The wall 136 of the cassette 130 has a plurality of substrate storage slots 138. Each substrate storage slot 138 is evenly spaced along the wall 136 of the cassette 130. Each substrate storage slot 138 is configured to hold a substrate 135 therein. The cassette 130 may have as many as fifty substrate storage slots 138 for holding the substrates 135. The cassette 130 provides an effective vehicle both for transferring a plurality of substrates 135 into and out of the batch processing chamber 100 and for processing the plurality of substrates in the internal volume 115.

The controller 180 controls the operation of the batch processing chamber 100. The controller 180 controls the operation of the gas panel 150, the condenser 160, the pump 170, the isolation valves 155 and 165, as well as the power source 145. The controller 180 is also communicatively connected to the temperature sensor 116, the pressure sensor 114, and the cooling channel 124. The controller 180 includes a central processing unit (CPU) 182, a memory 184, and a support circuit 186. The CPU 182 may be any form of a general purpose computer processor that may be used in an industrial setting. The memory 184 may be a random access memory, a read-only memory, a floppy, or a hard disk drive, or other forms of digital storage. The support circuit 186 is conventionally coupled to the CPU 182 and may include cache, clock circuits, input/output systems, power supplies, and the like.

Figure 2:
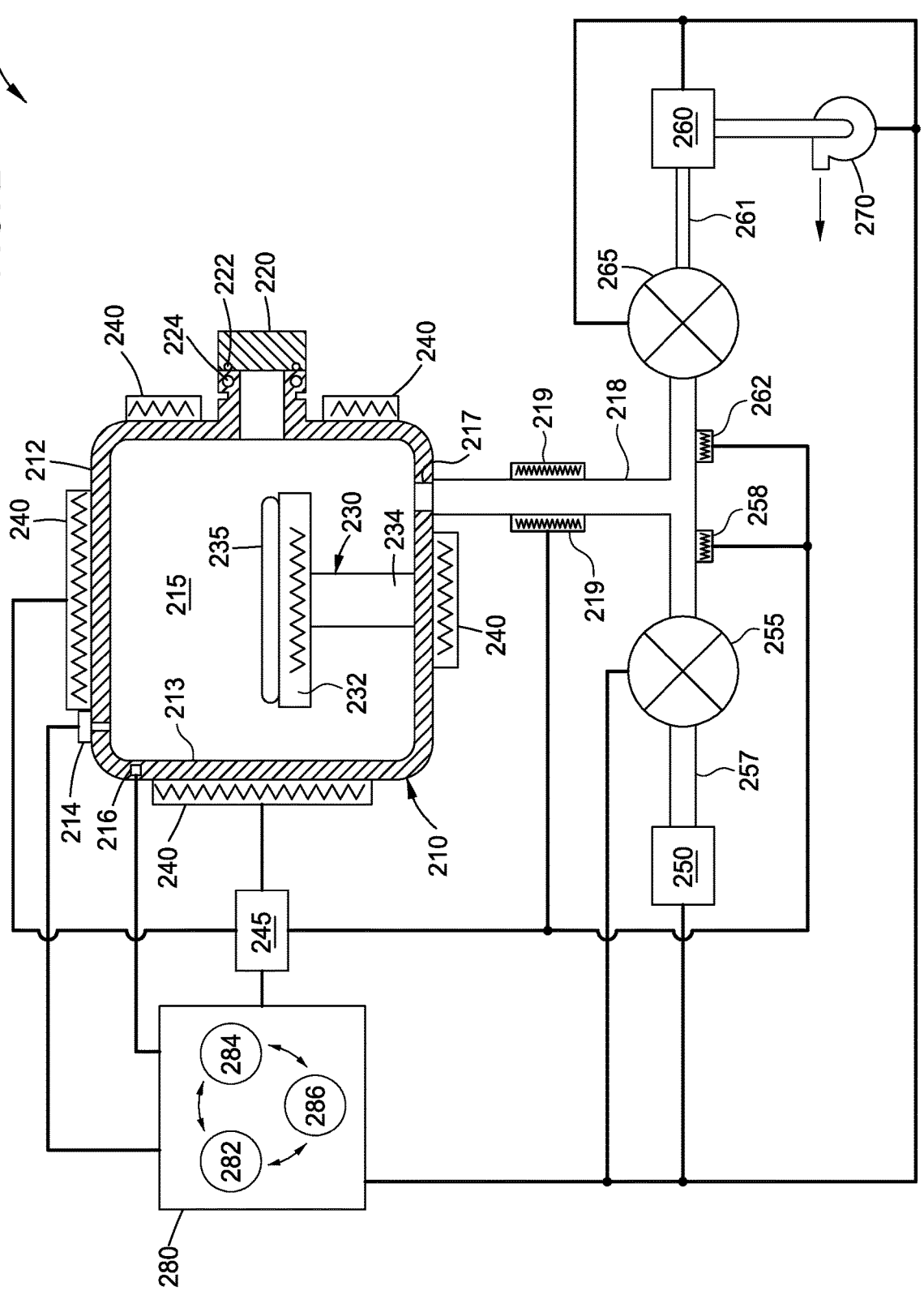
FIG. 2 illustrates a schematic front cross-sectional view of a single substrate processing chamber, according to one embodiment.

FIG. 2 is a schematic front cross-sectional view of a single substrate processing chamber 200, according to one embodiment. The single substrate processing chamber 200 has a body 210 with an outer surface 212 and an inner surface 213 that encloses an internal volume 215. In some embodiments, such as in FIG. 2, the body 210 has an annular cross section, though in other embodiments the cross-section of the body may be rectangular or any closed shape. The outer surface 212 of the body 210 may be made from a corrosion resistant steel (CRS), such as, but not limited to, stainless steel. The inner surface 213 of the body 210 may be made from nickel-based steel alloys that exhibit high resistance to corrosion, such as, but not limited to, HASTELLOY®, ICONEL®, and MONEL®.

A substrate support 230 is disposed within the internal volume 215. The substrate support 230 has a stem 234 and a substrate-supporting body 232 held by the stem. The substrate-supporting body 232 is actuated to raise or lower within the internal volume 215 of the single substrate processing chamber 200 for disposing a substrate 235 thereon. The substrate-supporting body 232 optionally has a resistive heating element 231 embedded therein.

The single substrate processing chamber 200 has an opening 211 through the body 210 through which substrates 235 can be loaded and unloaded to and from the substrate support 230 disposed in the internal volume 215. The opening 211 has a door 220 that is configured to selectively seal the internal volume 215. A seal 222 is utilized to seal the door 220 in order to seal the internal volume 215 for processing. The seal 222 may be made, for example, from a polymer like a fluoropolymer, such as, but not limited to, a perfluoroelastomer and polytetrafluoroethylene (PTFE). A cooling channel 224 is disposed adjacent to the door 220, wherein a cooling agent is flowed in order to maintain the seals 222 below the maximum safe-operating temperature of the seals. The flow of the cooling agent is controlled by the controller 280 through feedback received from a temperature sensor 216 or a flow sensor (not shown).

The single substrate processing chamber 200 has a port 217 through the body 210. The port 217 has a pipe 218 therethrough, which is coupled to a heater 219. One end of the pipe 218 is connected to the internal volume 215. The other end of the pipe 218 bifurcates into an inlet conduit 257 and an outlet conduit 261. The inlet conduit 257 is fluidly connected to a gas panel 250 via an isolation valve 255 and further coupled to a heater 258. The outlet conduit 261 is fluidly connected to a condenser 260 via an isolation valve 265 and coupled to a heater 262. The heaters 219, 258, and 262 are configured to maintain a processing gas flowing through the pipe 218, inlet conduit 257, and the outlet conduit 261 respectively at a temperature above the condensation point of the processing gas. The heaters 219, 258, and 262 are powered by a power source 245.

The gas panel 250 and the pressure sensor 214 are substantially similar in nature and function as the gas panel 150 and the pressure sensor 114 of FIG. 1. The condenser 260 is substantially similar in nature and function as the condenser 160 of FIG. 1. The pump 270 is substantially similar in nature and function as the pump 170 of FIG. 1. One or more heaters 240 are disposed on the body 210 and configured to heat the internal volume 215 within the single substrate processing chamber 200. The heaters 240 are also substantially similar in nature and function as the heaters 140 used in the batch processing chamber 100. Further, the controller 280 is similar to the controller 180 of FIG. 1, and the central processing unit (CPU) 282, the memory 284, and the support circuit 286 are similar to the CPU 182, the memory 184, and the support circuit 186 of FIG. 1, respectively.

Figure 3:
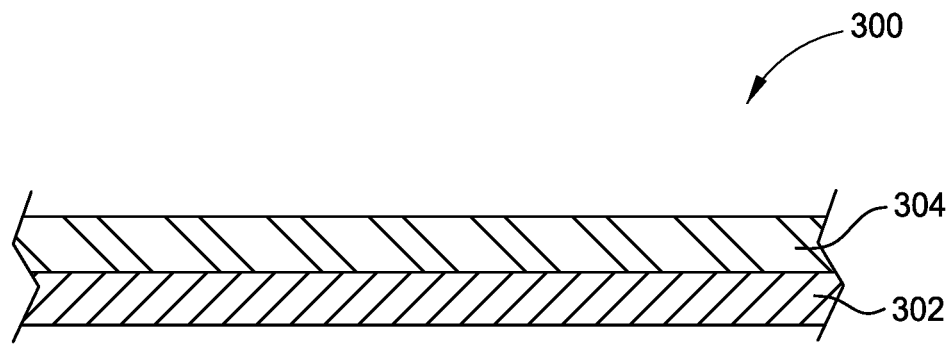
FIG. 3 illustrates a section of an electronic device, according to one embodiment.

FIG. 3 is a section of an electronic device 300, according to one embodiment. The electronic device 300 includes a substrate 302 with a spacer layer 304 formed thereon. In some embodiments, the substrate 302 is a bare silicon, III-V, or germanium wafer. The substrate includes silicon (Si) and germanium (Ge), according to one embodiment. In another embodiment, the substrate 302 further includes a thin film disposed thereon. The substrate 302 can be a photomask, a semiconductor wafer, or other workpiece. The substrate includes a fin field effect transistor (FinFET) structure, according to one embodiment. The substrate 302 includes any material to make any of integrated circuits, passive (e.g., capacitors, inductors) and active (e.g., transistors, photo detectors, lasers, diodes) microelectronic devices, according to some embodiments. The substrate 302 includes insulating and/or dielectric materials that separate such active and passive microelectronic devices from a conducting layer or layers that are formed thereon, according to one embodiment. In one embodiment, the substrate 302 is a semiconductor substrate that includes one or more dielectric layers e.g., silicon dioxide, silicon nitride, sapphire, and other dielectric materials. In one embodiment, the substrate 302 is a wafer stack including one or more layers. The one or more layers of the substrate 302 can include conducting, semiconducting, insulating, or any combination thereof layers.

The spacer layer 304 is formed from a silicon carbide hydroxide (SiCOH) film, according to one embodiment. The spacer layer 304 is formed by depositing a silicon carbon amine (SiCNH) film using an atomic layer deposition (ALD) process, according to one embodiment. However, other methods may be used, such as, but not limited to, chemical vapor deposition (CVD), physical vapor deposition (PVD), plasma enhanced atomic layer deposition (PEALD), and plasma enhanced chemical vapor deposition (PECVD). After treatment using high pressure steam as described in reference to FIG. 4, the SiCNH film is converted to a thermally stable SiCOH film.

Figure 4:
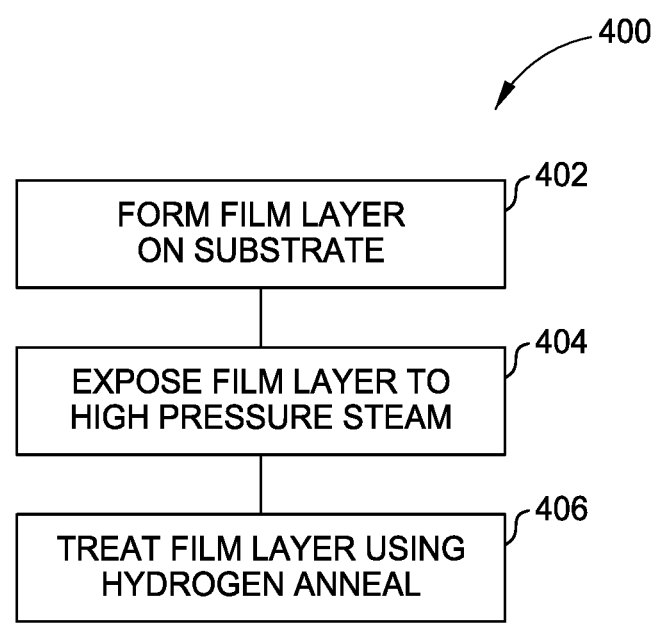
FIG. 4 is a flow diagram of method operations for forming a spacer layer, according to one embodiment.

FIG. 4 is a flow diagram of method operations for forming a spacer layer 400, such as spacer layer 304 shown in FIG. 3, according to one embodiment. Although the method 400 operations are described in conjunction with FIG. 4, persons skilled in the art will understand that any system configured to perform the method operations, in any order, falls within the scope of the embodiments described herein. The method 400 of FIG. 4 may be utilized with the batch processing chamber 100 or the single substrate processing chamber 200 described above. However, other similar chambers may be used for the method 400.

The method 400 begins at operation 402, where a substrate is disposed within an internal volume of a processing chamber, and a film is formed on a substrate. The film includes silicon (Si), according to one embodiment. The film includes Si, carbon (C), nitrogen (N), and hydrogen (H), according to another embodiment. The film is a silicon carbide amide (SiCNH) film, according to yet another embodiment. The film layer may be deposited using a process, such as atomic layer deposition (ALD), chemical vapor deposition (CVD), physical vapor deposition (PVD), plasma enhanced atomic layer deposition (PEALD), and plasma enhanced chemical vapor deposition (PECVD), among others. The film layer is deposited in a regime that minimizes terminal methyl ($CH_3$) groups which make the film layer thermally unstable, according to one embodiment.

At operation 404, the film layer is exposed to a process gas, the process gas including high pressure steam, to anneal the film layer in the internal volume of the processing chamber. The substrate may be transferred to a new chamber, or the substrate can be exposed to the process gas in the same chamber as that used to deposit the film layer. High pressure steam is defined as steam provided at a pressure above 2 bar. The high pressure steam is at a pressure in a range, for example, between about 2 bar and about 50 bar, such as about 20 bar. The steam is, for example, dry steam or superheated steam. During exposure of the film layer to process gas, a pedestal supporting the substrate is maintained at a temperature, for example, between about 200 degrees Celsius to about 500 degrees Celsius, such as about 300 degrees Celsius. The process gas further includes a carrier gas, such as an inert gas, like argon or nitrogen gas ($N_2$), among others, according to some embodiments. The steam is in a concentration of about 5% to about 100% of the process gas. The film layer is exposed to the process gas for a processing time of greater than about 2 minutes, for example, between about 2 minutes and about 120 minutes, such as about 10 minutes. During processing, the processing chamber body is maintained at about 200 degrees Celsius or higher in order to prevent the steam from condensing onto the processing chamber body. The exposure to the process gas chemically converts the film to a reacted film. The reacted film includes Si, according to one embodiment. The reacted film includes Si, C, oxygen (O), and H, according to another embodiment. The reacted film is a silicon carbon hydroxide (SiCOH) film, according to yet another embodiment. The reacted film includes stoichiometrically more oxygen than nitrogen, according to yet another embodiment, which can be combined with other embodiments. The method 400 converts the thermally unstable SiCNH film to a more thermodynamically stable SiCOH film with a low dielectric constant, according to one embodiment.

After the desired processing time, the process gas is evacuated from the internal volume. A sub-atmospheric pressure environment is created in the internal volume while an inert gas, such as nitrogen or other noble gas, is introduced into the internal volume. The inert gas purges the processing chamber to remove excess moisture.

At operation 406, the film layer is optionally treated with a hydrogen anneal, wherein a hydrogen-containing gas is flowed through the processing chamber. The hydrogen-containing gas includes hydrogen gas ($H_2$), according to one embodiment. The hydrogen anneal is conducted at a temperature in a range of about 600 degrees Celsius to about 800 degrees Celsius. The hydrogen anneal is also conducted in a sub-atmospheric pressure condition, such as between about 5 Torr to about 500 Torr. The hydrogen anneal further lowers the dielectric constant and greatly reduces the leakage current of the formed layer.

SiCOH is a common low-k dielectric material used in the art for FinFETs. A common procedure in the art includes depositing a SiCNH film on a substrate, and the SiCNH film is annealed to form SiCOH. Conventional anneal methods, such as furnace annealing, however, often do not adequately convert the SiCNH film to a SiCOH film. For example, the etch rate of the film layer after using conventional methods is significantly higher than desired. Thermal stabilizing carbon is also released from the film layer using conventional techniques. Also, the substrate is undesirably oxidized using conventional techniques. Further, steam concentration is not able to be maintained during processing in a furnace anneal process.

A method 400 is provided for conversion of a film including silicon, carbon, nitrogen, and hydrogen to a reacted film including silicon, carbon, oxygen, and hydrogen. The as deposited film on the underlying substrate is treated with a process gas, wherein the process gas includes high pressure steam. The interaction with the high pressure steam removes nitrogen from the film and incorporates oxygen into the film.

Using the approach described herein allows for a low-k film layer that is thermally stable. High pressure steam greatly increases the concentration of steam available to convert the SiCNH film to a SiCOH film and is able to do so in a short time and at a low temperature. The substrate is not oxidized and the stabilizing carbon is not removed from the film. Thus, the resultant SiCOH film layer provides a low dielectric constant k value of about 4 or less that is thermally stable and exhibits low etch rates (less than about 1 Å/min) that is desired.

While the foregoing is directed to embodiments of the present disclosure, other and further embodiments of the disclosure may be devised without departing from the basic scope thereof, and the scope thereof is determined by the claims that follow.

What is claimed is:

1. A method of forming a spacer layer, the method comprising:
    disposing a substrate in an internal volume of a processing chamber, the substrate having a film formed thereon, the film comprising silicon, carbon, nitrogen, and hydrogen;
    introducing a process gas into the processing chamber, wherein the process gas comprises high pressure steam;
    exposing the film to the process gas to form a reacted film, such that the reacted film comprises silicon, carbon, oxygen, and hydrogen; and
    purging the internal volume with an inert gas.

2. The method of claim 1, wherein the high pressure steam is at a pressure between about 2 bar and about 50 bar.

3. The method of claim 1, wherein the process gas further comprises a carrier gas.

4. The method of claim 3, wherein the high pressure steam is in a concentration of about 5% to about 100% of the process gas.

5. The method of claim 1, wherein the film is exposed to the process gas for a time between about 2 minutes and about 120 minutes.

6. The method of claim 1, wherein the film is formed by an atomic layer deposition (ALD) process.

7. The method of claim 1, wherein the substrate is disposed on a substrate support and the substrate support is maintained at a temperate between about 200 degrees Celsius and about 500 degrees Celsius during exposing the film to the process gas.

8. The method of claim 1, further comprising treating the reacted film with a hydrogen anneal.

9. The method of claim 1, wherein the substrate comprises a fin field effect transistor structure.

10. A method of forming a spacer layer, the method comprising:
    disposing a substrate in an internal volume of a processing chamber, the substrate having a film formed thereon, the film comprising silicon, carbon, nitrogen, and hydrogen;
    introducing a process gas into the processing chamber, wherein the process gas comprises high pressure steam;
    exposing the film to the process gas to form a reacted film, such that the reacted film comprises silicon, carbon, oxygen, and hydrogen;
    purging the internal volume with an inert gas; and
    treating the reacted film with a hydrogen anneal.

11. The method of claim 10, wherein the high pressure steam is at a pressure between about 2 bar and about 50 bar.

12. The method of claim 10, wherein the process gas further comprises a carrier gas.

13. The method of claim 12, wherein the high pressure steam is in a concentration of about 5% to about 100% of the process gas.

14. The method of claim 10, wherein the film is exposed to the process gas for a time between about 2 minutes and about 120 minutes.

15. The method of claim 10, wherein the substrate comprises a fin field effect transistor structure.

16. The method of claim 10, wherein the substrate is disposed on a substrate support, and the substrate support is maintained at a temperate between about 200 degrees Celsius and about 500 degrees Celsius during exposing the film to the process gas.

17. The method of claim 10, wherein the hydrogen anneal comprises exposing the reacted film to a hydrogen-containing gas, the hydrogen-containing gas comprising hydrogen gas.

18. A method of forming a spacer layer, the method comprising:
    disposing a substrate in an internal volume of a processing chamber, the substrate having a film formed thereon, the film comprising silicon, carbon, nitrogen, and hydrogen, the substrate comprising silicon and germanium;
    introducing a process gas into the processing chamber, wherein the process gas comprises high pressure steam;
    exposing the film to the process gas to form a reacted film, such that the reacted film comprises silicon, carbon, oxygen, and hydrogen;
    purging the internal volume with an inert gas; and
    treating the reacted film with a hydrogen anneal.

19. The method of claim 18, wherein the substrate is disposed on a substrate support, and the substrate support is maintained at a temperate between about 200 degrees Celsius and about 500 degrees Celsius during exposing the film to the process gas.

20. The method of claim 18, wherein the substrate comprises a fin field effect transistor structure.

* * * * *